(12) United States Patent
Shimazu et al.

(10) Patent No.: US 6,703,623 B1
(45) Date of Patent: Mar. 9, 2004

(54) ELECTRON BEAM PROXIMITY EXPOSURE APPARATUS

(75) Inventors: Nobuo Shimazu, Machida (JP); Takao Utsumi, Watchung, NJ (US)

(73) Assignee: LEEPL Corporation, Machida (JP)

( * ) Notice: Subject to any disclaimer, the term of this patent is extended or adjusted under 35 U.S.C. 154(b) by 441 days.

(21) Appl. No.: 09/670,262

(22) Filed: Sep. 27, 2000

(51) Int. Cl.[7] .................................................. G03F 7/00
(52) U.S. Cl. .................... 250/492.2; 250/310; 250/311; 250/398; 250/491.1; 250/492.22; 250/492.3
(58) Field of Search ............................... 250/310, 398, 250/491.1, 492.22, 492.3, 492.2, 311; 430/296, 5, 30

(56) References Cited

U.S. PATENT DOCUMENTS

| | | | |
|---|---|---|---|
| 4,785,187 A | * 11/1988 | Kariya et al. | 250/491.1 |
| 5,006,795 A | * 4/1991 | Yoshizawa et al. | 324/751 |
| 5,382,484 A | * 1/1995 | Hosono | 430/5 |
| 5,557,105 A | * 9/1996 | Honjo et al. | 250/310 |
| 5,831,272 A | 11/1998 | Utsumi | |
| 5,838,433 A | * 11/1998 | Hagiwara | 356/364 |
| 5,895,924 A | * 4/1999 | Yasuda et al. | 250/492.22 |
| 5,986,765 A | * 11/1999 | Nakasuji | 356/399 |
| 6,038,015 A | * 3/2000 | Kawata | 355/67 |
| 6,106,582 A | * 8/2000 | Heyder et al. | 29/25.01 |
| 6,327,022 B1 | * 12/2001 | Nishi | 355/53 |
| 2001/0040230 A1 | * 11/2001 | Yoo et al. | 251/326 |

OTHER PUBLICATIONS

Low Energy Electron–Beam Proximity Projection Lithography: Discovery of Missing Link, Takao Utsumi, J. Vac. Sci. Technol. B 17(6), Nov./Dec. 1999, pp. 2897–2902.

High Throughput Submicron Lithography with Electron Beam Proximity Printing, H. Bohlen et al., Solid State Technology, Sep. 1984, pp. 210–217.

* cited by examiner

Primary Examiner—John R. Lee
Assistant Examiner—James P. Hughes
(74) Attorney, Agent, or Firm—Nixon Peabody LLP; David S. Safran

(57) ABSTRACT

The electronic beam proximity exposure apparatus comprises: an electron beam proximity exposure section which exposes a pattern corresponding to an aperture of a mask on a surface of an object with an electron beam having passed through the aperture of the mask, the mask being disposed in proximity to the surface of the object; a mask inspecting section which inspects the mask; and a mask carrying mechanism which carries the mask between the electron beam proximity exposure section and the mask inspecting section, and is characterized in that the electron beam proximity exposure section, the mask inspecting section and the mask carrying mechanism are communicated with one another through a common vacuum path so that the mask can be carried in a vacuum condition between the electron beam proximity exposure section and the mask inspecting section. This realizes the electronic beam proximity exposure apparatus that enhances a reliability by preventing a defect from being produced due to adhering dust or the like.

29 Claims, 8 Drawing Sheets

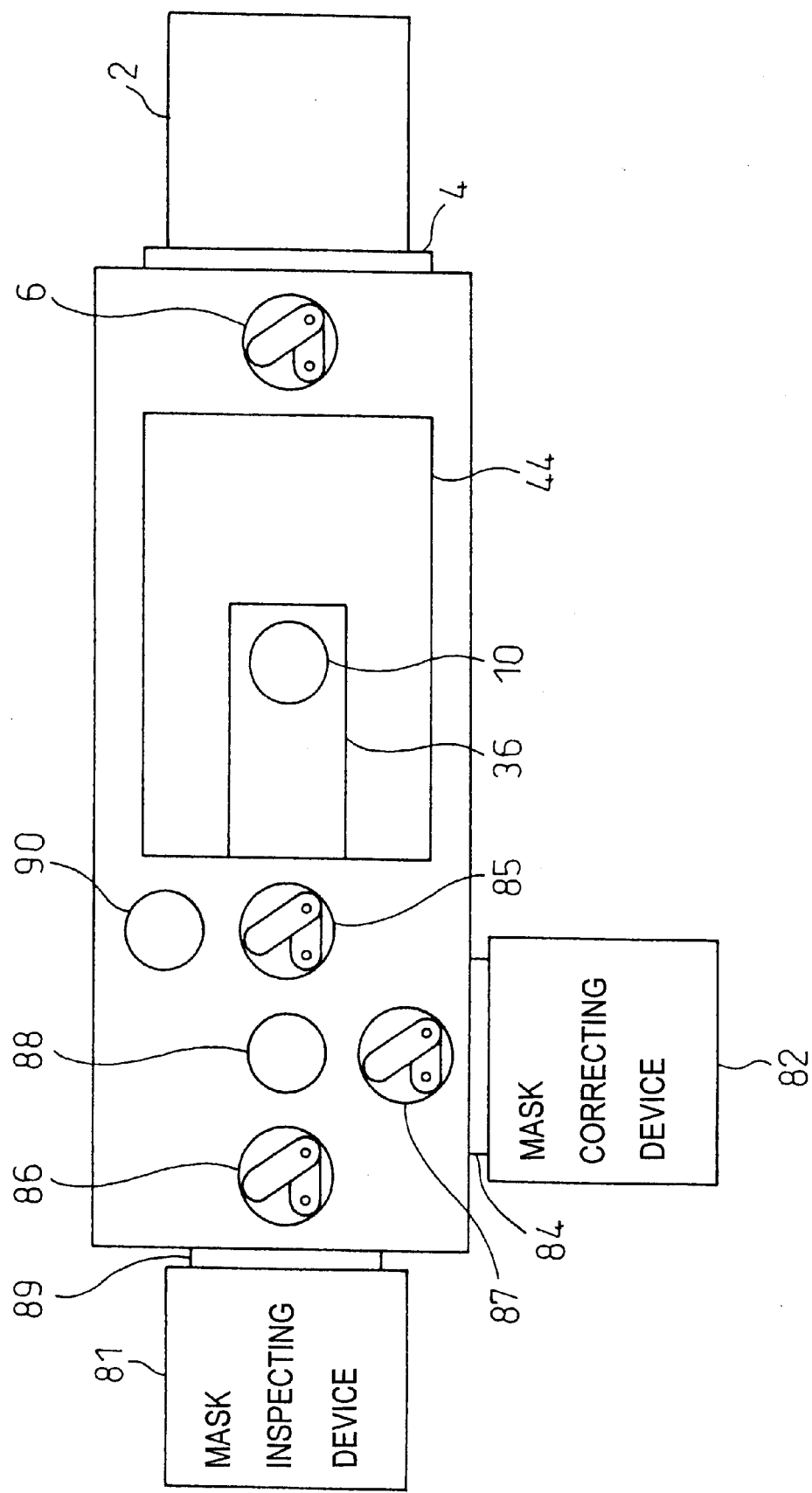

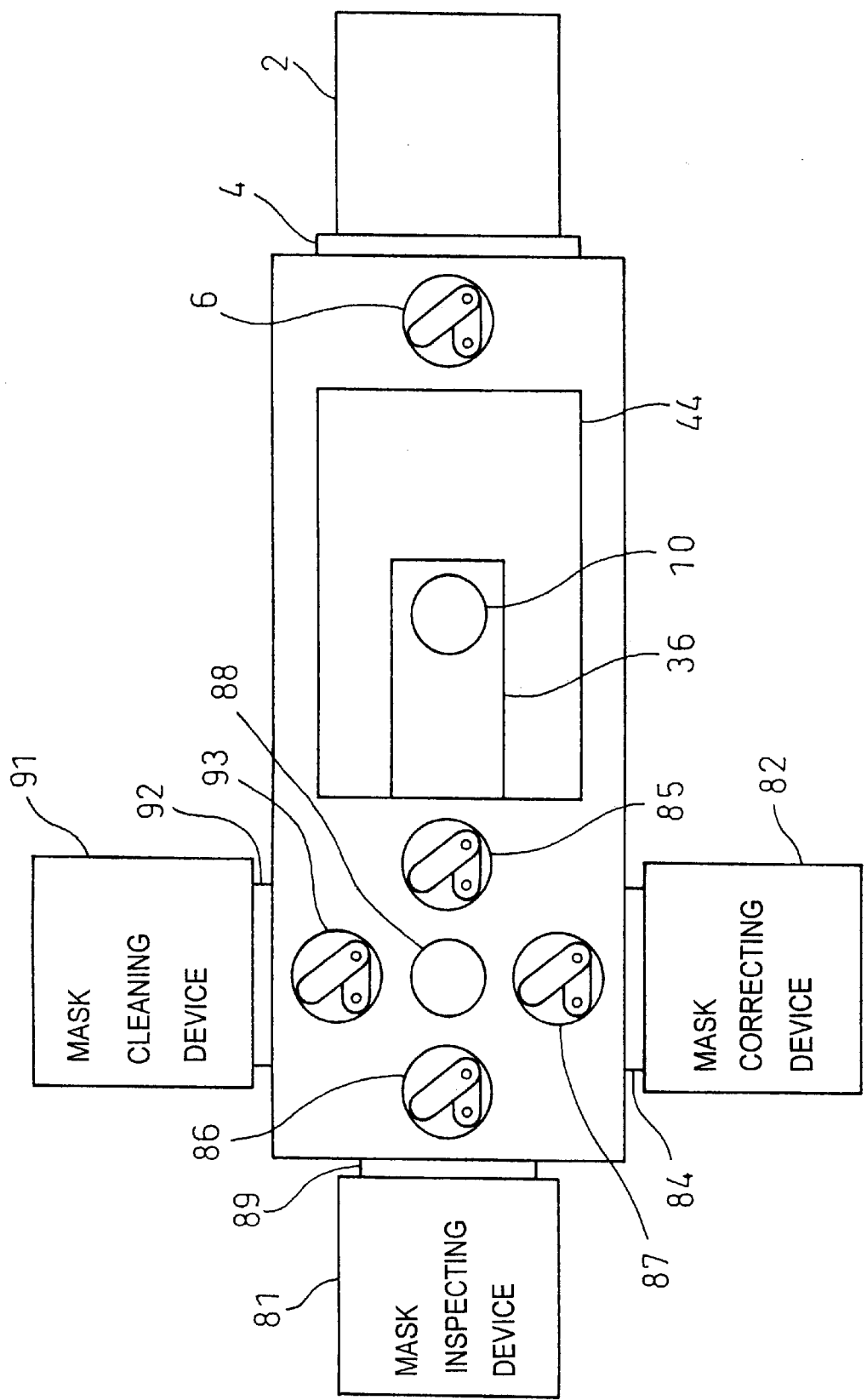

ELECTRON BEAM PROXIMITY EXPOSURE APPARATUS

BACKGROUND OF THE INVENTION

1. Field of the Invention

The present invention relates to an exposure apparatus which is used to expose a fine pattern in a manufacturing process of a semiconductor integrated circuit, etc., and more particularly to an electron beam proximity exposure apparatus in which a mask having an aperture corresponding to a pattern to be exposed is disposed in proximity to a surface of an object such as a semiconductor wafer and the mask is irradiated with an electron beam, thereby performing exposure of the pattern to an electron beam having passed through the aperture.

2. Description of Related Art

Attempts are being made to enhance integration degrees of semiconductor integrated circuits and finer circuit patterns are desired. Presently, a limit of the finer circuit patterns is defined mainly by exposure apparatuses, and a stepper which is an optical exposure apparatus takes various measures such as a light source which emits rays having shorter wavelengths, a larger NA (numerical aperture) and a phase shift method. However, much finer circuit patterns involve various kinds of problems such as a rapid increase of a manufacturing cost. New types of exposure apparatus such as an electron beam direct lithography apparatus and X-ray exposure apparatus have therefore been developed, but there still remain many problems in terms of stability, productivity, cost and so on.

An electron beam proximity exposure system is conventionally under research and development, since the exposure principle thereof is simple, as "High Throughput Submicron Lithography with Electron Beam Proximity Printing" (H. Bohlen et al., Solid State Technology, September 1984, pp. 210–217) (hereinafter referred to as literature 1) exemplifies. However, it was thought that it was of no practical use since it was difficult to eliminate the proximity effect peculiar to the electron beam.

U.S. Pat. No. 5,831,272 (corresponding to Japanese Patent No. 2951947) and "Low energy electron-beam proximity projection lithography: Discovery of missing link" (Takao Utsumi, J. Vac. Sci. Technol. B 17(6), November/December 1999, pp. 2897–2902) disclose an electron beam proximity exposure apparatus that overcomes the above-mentioned problems and is usable for processing with very fine resolution at a mass production level.

FIG. 1 is a diagram showing a fundamental configuration to realize the electron beam proximity exposure apparatus disclosed by U.S. Pat. No. 5,831,272. In an electron optical column 10 are disposed an electron gun 14 which emits electron beam 15, a condenser lens 18 which collimates the electron beam 15, a main deflecting coil 20 and a subsidiary deflecting coil 50 as shown in FIG. 1. Though the main deflecting coil 20 is shown as a single deflecting coil in FIG. 1, they actually are configured in two stages so as to obtain electron beams which are in parallel with an optical axis and have different irradiating locations by deflecting an electron beam with a deflecting coil in a first stage and then in a reverse amount with a deflecting coil in a second stage. Similarly, the subsidiary deflecting coil 50 is also configured actually in two stages so that fine adjustment of an irradiating angle is possible without changing the irradiating locations changed with the main deflecting coils by deflecting the electron beams with a deflecting coil in a first stage and then in a reverse amount twice as large with a deflecting coil in a second stage. In a vacuum object chamber 8 are disposed a mask stage 36 which holds and moves a mask 30, a reflected electron detector 38 which detects reflected electrons, a wafer stage 44 which holds and moves a wafer 40, a standard mark 60 disposed on the wafer stage 44, and a height detector 46 which detects height of the wafer 40. Furthermore, a laser length measuring device 38 for the mask stage which detects travel amount of the mask stage 36 and a laser length measuring device 48 for the wafer stage which detects travel amount of the wafer stage 44 are disposed so that the travel amounts of the stages can be detected with remarkably high accuracy. The wafer stage 44 is movable in directions of at least two axes. Though the reflected electron detector 38 is used in this configuration, a secondary electron detector can also be used in place of this detector which detects secondary electrons.

The electron beam proximity exposure apparatus is controlled by a computer 70. Signals detected by the laser length measuring device 38 for the mask stage and the laser length measuring device 48 for the wafer stage are supplied to a data bus of the computer 70. Signals detected by the reflected electron detector 38, a detector disposed on the standard mark and the height detector 46 are supplied to a signal processor circuit 76, converted into digital signals and then supplied to the data bus of the computer 70. The condenser lens 18 is an electromagnetic lens or an electrostatic lens which is controlled by the computer 70 by way of a condenser lens power source 71. The computer 70 supplies deflection amount data to a digital arithmetic circuit 75, which performs an operation to correct the deflection amount data according to previously stored correction data and supplies corrected data to a main DAC/AMP 73 and a subsidiary DAC/AMP 74. The main DAC/AMP 73 and the subsidiary DAC/AMP 74 convert the corrected deflection amount data into analog signals, amplify the analog signals and supply the resulting signals to the main deflecting coil 20 and the subsidiary deflecting coil 50. The electron beam is deflected as desired accordingly.

The exposure apparatus described above positions the wafer 40 to the mask and exposes a pattern over an entire surface of the mask by scanning the electron beam 15.

In case of a photomask to be used in a optical light exposure apparatus such as a stepper, a chromium layer or the like is patterned on a glass substrate, the glass substrate is checked whether or not the pattern is formed as predetermined and a pellicle layer is formed as a protective film on the pattern immediately when the pattern is free from a defect or after correcting a defect with a correcting device if any. A surface of the pellicle layer is monitored for dust adhesion and is cleaned when dust adheres on a problematic level. The pattern is not injured by cleaning. The surface of the pellicle layer causes defocusing by its thickness and no particular problem occurs so far as the adhering dust consists of small particles.

In contrast, a mask 30 which is to be used in the above described electron beam proximity exposure apparatus needs to be a stencil mask having an aperture formed as a hole on which the above described pellicle layer cannot be formed. Accordingly, dust or the like adhering to a surface of the mask causes a serious problem in the above described electron beam proximity exposure apparatus. This mask for proximity exposure is set in the electron beam exposure apparatus after being manufactured with a separate apparatus and inspected, but it is impossible to completely prevent dust from adhering to the surface of the mask for proximity exposure while it is carried from an inspecting device to the electron beam exposure apparatus. Accordingly, there arises a problem that even a mask which is free from a defect at an inspection stage cannot be warranted to be free from a defect when it is set in the electron beam exposure apparatus.

When a defect is produced by dust which adheres during use in the electron beam proximity exposure apparatus in particular, the surface of the mask can hardly be cleaned directly and a defective portion will be corrected with an apparatus such as a correcting device. When the mask for proximity exposure is removed from the electron beam proximity exposure apparatus, carried to an inspecting device and the correcting device or a cleaning device and set once again in the electron beam proximity exposure apparatus after correction or cleaning is completed, however, it is impossible to completely prevent dust from adhering to the surface of the mask for proximity exposure as described above. Thus, it is impossible for the above described electron beam proximity exposure apparatus to assure that a mask for proximity exposure is free from a defect which is set in the exposure apparatus.

Furthermore, a mask 30 which is to be used in the above described electron beam proximity exposure apparatus is a stencil mask having an aperture formed as a hole. An annular pattern which has a small circular square pattern 342 in a large square pattern 341 and an aperture as a portion 343 between the large and small square patterns, for example as shown in FIG. 2(*a*), cannot be exposed with a single mask, and it is necessary to divide this annular pattern into a pattern 344, 345 as shown in FIGS. 2(*b*) and 2(*c*) and a pattern 346, 347, and expose these patterns in two stages. In other words, it is necessary to prepare two masks for proximity exposure, expose the pattern with one of the masks set in the electron beam proximity exposure apparatus and then expose the pattern with the other mask set in the electron beam proximity exposure apparatus. In this case, however, it is necessary after first exposure to take a wafer out of a vacuum chamber into an atmospheric environment and carry the wafer again into the vacuum chamber of the electron beam proximity exposure apparatus for second exposure. In other words, it is necessary to carry the wafer repeatedly between a vacuum condition and the atmospheric condition. Accordingly, there arises not only a problem of lowered a throughput but also a problem to allow dust or the like to easily adhere, thereby lowering a yield.

SUMMARY OF THE INVENTION

A first object of the present invention is to solve such a problem or to make it possible to dispose a mask for proximity exposure which is free from a defect in an electron beam proximity exposure apparatus.

A second object of the present invention is to solve such a problem or to realize an electron beam proximity exposure apparatus which provides high throughput and high yield.

To accomplish the above described first object, an electron beam proximity exposure apparatus according to a first aspect of the present invention comprises a mask inspecting device, a mask correcting device, a mask cleaning device or a combination of these devices and a mask carrying path which allows to carry a mask in a vacuum condition among these devices.

More particularly, the electron beam proximity exposure apparatus according to the present invention comprises an electron beam proximity exposure section which exposes a pattern corresponding to an aperture of a mask on a surface of an object with an electron beam having passed through the aperture of the mask disposed in proximity to the surface of the object, and/or a mask inspecting section which inspects the mask and/or a mask correcting section which corrects the mask and/or a mask cleaning section which cleans the mask and a mask carrying mechanism which carries the mask between the electron beam proximity exposure section and the mask correcting section and/or the mask cleaning section, and is characterized in that the electron beam proximity exposure section, and/or the mask inspecting section and/or the mask inspecting section and/or the mask correcting section and/or the mask cleaning section and the mask carrying mechanism are communicated with one another through a common vacuum path so that a mask can be carried in a vacuum condition among these members.

Since it may be necessary to introduce a gas into a vacuum chamber through the mask correcting section and/or the mask cleaning section, it is desirable that the electron beam proximity exposure apparatus further comprises a mask correcting section shielding mechanism and/or a mask cleaning section shielding mechanism which shield interiors of the mask correcting section and/or the mask cleaning section from other sections.

The electron beam proximity exposure apparatus according to the first aspect of the present invention remarkably lowers a possibility of adhesion of dust and the like in the course of carriage since the mask carrying mechanism is capable of disposing a mask inspected with the mask inspecting section, a mask corrected with the mask correcting section and a mask cleaned with the mask cleaning section at a predetermined location in the electron beam proximity exposure section through the common vacuum path in no contact with external air.

In order to accomplish the above described secondary object of the present invention, an electron beam proximity exposure apparatus in a second mode of the present invention comprises two electron beam proximity exposure sections in a vacuum chamber to expose a pattern twice with two masks or a mask switching mechanism which is capable of switching either of two masks in an electron beam proximity exposure section.

Speaking more concretely, the electron beam proximity exposure apparatus according to the second aspect of the present invention is an electron beam proximity exposure apparatus which exposes a pattern corresponding to an aperture of a mask on a surface of an object with an electron beam that has passed through the aperture of the mask disposed in proximity of the surface of the object, in which the pattern is exposed twice first with a first mask and then with a second mask. Furthermore, the exposure apparatus comprises a first electron beam proximity exposure section comprising a first electron beam source which emits a first electron beam, a first mask which is disposed in a path of the first electron beam and a first stage which holds and moves the object, a second electron beam proximity exposure section comprising a second electron beam source which emits a second electron beam, a second mask which is disposed in a path of the second electron beam and a second stage which holds and moves the object, and an object carrying mechanism which carries the object exposed in the first electron beam proximity exposure section to the second electron beam proximity exposure section, the first electron beam proximity exposure section, the second electron beam proximity exposure section and the object carrying mechanism communicating with one another through a common vacuum chamber.

Furthermore, another electron beam proximity exposure apparatus according to the second aspect of the present invention is an electron beam proximity exposure apparatus comprising a source of an electron beam which emits an electron beam, a mask which is disposed in a path of the electron beam and a stage which holds and moves an object and configured to expose a pattern corresponding to an aperture of a mask on a surface of an object with an electron beam having passed through the aperture of the mask disposed in proximity of the surface of the object, characterized in that the pattern is exposed twice with a first mask and a second mask and that the exposure apparatus comprises a mask switching mechanism which selects either of the first mask or the second mask to be used.

It is desirable that a mask inspecting device, a mask correcting device and a mask cleaning device are integrated with one another in the electron beam proximity exposure apparatus according to the second aspect like that according to the first aspect.

The electron beam proximity exposure apparatus according to the second aspect of the present invention is capable of performing the exposure successively with the first and second masks while maintaining an object in the vacuum chamber, thereby enhancing a throughput and a yield by reducing adhesion of dust and the like.

BRIEF DESCRIPTION OF THE DRAWINGS

The nature of this invention, as well as other objects and advantages thereof, will be explained in the following with reference to the accompanying drawings, in which like reference characters designate the same or similar parts throughout the figures and wherein:

FIG. 7 is a diagram showing a configuration of an electron beam proximity exposure apparatus according to a fourth embodiment of the present invention; and FIG. 8 is a diagram showing a configuration of an electron beam proximity exposure apparatus according to a fifth embodiment of the present invention.

DETAILED DESCRIPTION OF THE PREFERRED EMBODIMENT

Figure 1:
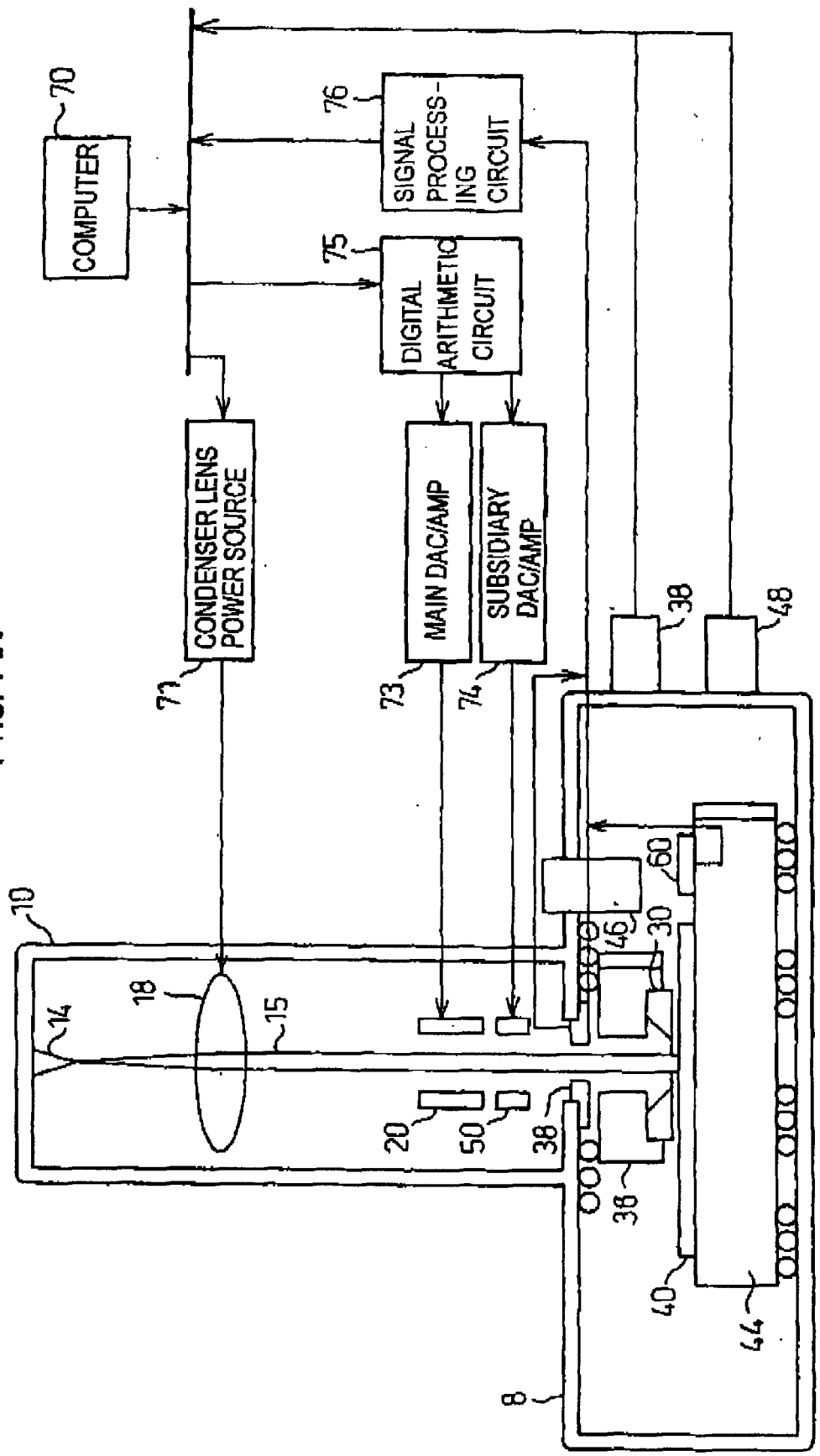
FIG. 1 is a diagram showing a fundamental configuration of an electron beam proximity exposure apparatus.
Figure 3:
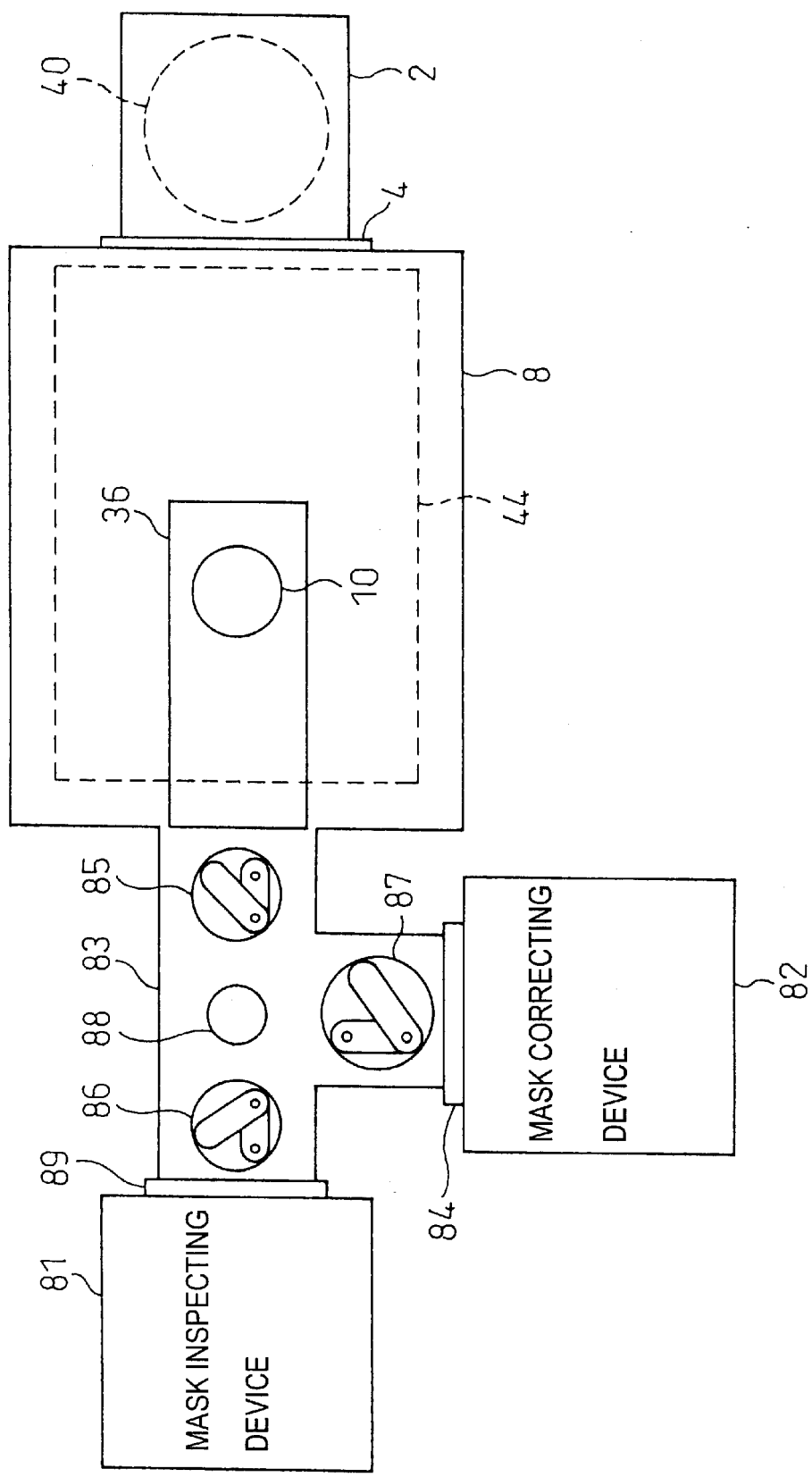
FIG. 3 is a diagram showing a configuration of an electron beam proximity exposure apparatus according to a first embodiment of the present invention.

FIG. 3 is a top view showing locations of sections of an electron beam proximity exposure apparatus according to a first embodiment of the present invention. In FIG. 3, a section represented by a reference number 8 is a vacuum object chamber which has a configuration similar to that shown in FIG. 1 and on which an electron optical column 10 is disposed. Reference number 44 designates a wafer stage as seen from a top and a reference number 36 denotes a mask stage as seen from a top. A wafer loader (not shown) takes a wafer 40 out of a wafer cassette 2 and loads the wafer 40 on the wafer stage 44. The wafer stage 44 electrostatically holds the mounted wafer 40, moves each die under the column 10, positions the die to a mask and exposes the die. The wafer 40 which has been exposed is returned to the wafer cassette 2 and the wafer loader takes out a wafer 40 to be exposed next to repeat similar operations. Reference number 4 represents a shielding mechanism which shields a vacuum object chamber 8 from an interior of the wafer cassette 2 when the wafer cassette 2 is to be removed from the vacuum object chamber 8 after completing exposure of all the wafers 40 contained in the wafer cassette 2. The wafer cassette 2 is removed after the shielding mechanism 4 shields the vacuum object chamber 8 from the interior of the wafer cassette 2. At this time, a gas is introduced into the wafer cassette 2 as occasion demands. Then, a wafer cassette 2 containing unexposed wafers 40 is set in position, the vacuum object chamber 8 and an interior of the wafer cassette 2 are set in an identical condition (vacuum condition) and the shielding mechanism 4 is opened so that the unexposed wafers 4 can be taken out of the wafer cassette 2.

Disposed on a left side of the vacuum object chamber 8 is a vacuum mask carrying path 83 which is communicated with the vacuum object chamber 8. A mask 30 can be moved to a left side of the vacuum object chamber 8 with the mask stage 36 and the mask 30 which is moved to the left side can be carried to an intermediate stage 88 with a mask carrying mechanism 85 when a chuck mechanism (not shown) is released on the mask stage 36. Furthermore, a mask carrying mechanism 86 is capable of carrying the mask 30 between the intermediate stage 88 and a mask inspecting device 81, and a mask carrying mechanism 87 is capable of carrying the mask 30 between the mask inspecting device 81 and a mask correcting device 82. That is, the mask 30 can be carried from a predetermined location of the column 10 to the mask inspecting device 81 and the mask correcting device 82 and vice versa. Reference number 84 represents a shielding mechanism which shields a mask carrying path 83 from an interior of the mask correcting device 82 and a reference number 89 designates a shielding mechanism which shields the mask carrying path 83 from an interior of the mask inspecting device 81: both the mechanisms being similar to the shielding mechanism 4.

This electron beam proximity exposure apparatus is configured to expose a pattern identical to a pattern of the mask 30 which has a line width, for example, not larger than 100 nm. The mask inspecting device 81 which inspects the mask 30 must be capable of inspecting whether or not a pattern of this line width is regular and performs an inspection using an electron beam. It is therefore necessary that a space in which the mask 30 is held in the mask inspecting device 81 is kept in a vacuum condition.

Figure 4:
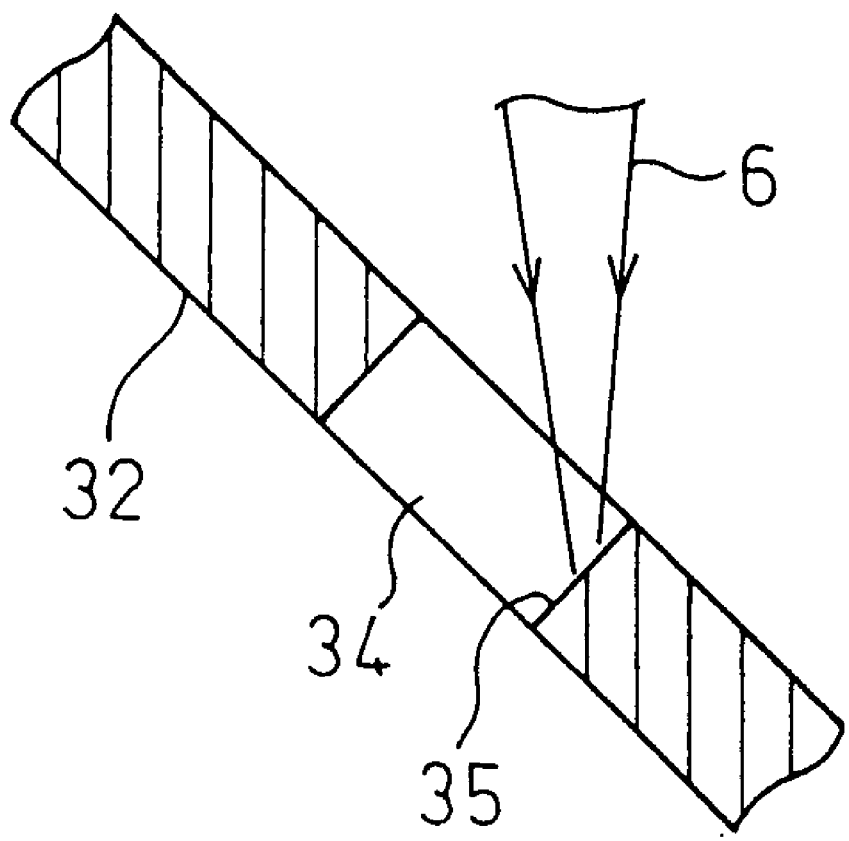
FIG. 4 is a diagram descriptive of irradiation with a converging ion beam for closing an aperture with a mask correcting device of the electron beam proximity exposure apparatus according to the first embodiment.

Used as the mask correcting device 82 is an apparatus which irradiates a converging ion beam used to correct a photomask or the like. Defects are classified into a "black defect" which closes an aperture and a "white defect" which opens a portion other than an aperture. To correct the "black defect", an opening is formed by irradiating with the converging ion beam. To correct the "white defect", a portion of the "white defect" is filled by irradiating a portion of the "white defect" with the converging ion beam while blasting a hydrocarbon based gas so as to allow carbide to adhere to a wall around the portion of the "white defect". In this case, the shielding mechanism 84 is closed to shield the interior of the mask correcting device 82 from the mask carrying path 83 since the hydrocarbon based gas is introduced into the interior of the mask correcting device 82 and an above described operation is performed while exhausting the gas. The mask 30 which is used in the electron beam proximity exposure apparatus is a stencil mask having an aperture formed as a hole, and when the carbide does not adhere to a surrounding wall simply by irradiating the converging ion beam, the mask 30 is inclined, for example as shown in FIG. 4 so that the carbide can adhere to any wall of the portion of the "white defect" by irradiating the portion with the converging ion beam.

When it is assumed that a mask 30 which is manufactured outside so as to be free from a defect is to be set in the electron beam proximity exposure apparatus, a problem is posed only by dust which adheres during carriage from a manufacturing location of the mask to the electron beam proximity exposure apparatus, whereby only "black defect" is produced without "white defect". In this case, it is unnecessary to dispose a mechanism which blasts the hydrocarbon based gas as far as the mask correcting device 82 can irradiate with the converging ion beam.

When the mask 30 manufactured outside is to be arranged in the column 10, the mask inspecting device 81 is first shielded from the mask carrying path 83 with the shielding mechanism 89, an atmosphere identical to a surrounding atmosphere is introduced into an interior of the mask inspecting device 81, the mask inspecting device 81 is opened and the mask 30 is set in the mask inspecting device 81. Subsequently, the mask inspecting device 81 is closed and its interior is set in a vacuum condition, and the shielding mechanism 89 is opened to set a condition where the interior of the mask inspecting device 81 is communicated with the mask carrying path 83. The mask 30 is inspected in this condition, and when the mask 30 is free from a defect, the mask 30 is immediately carried to the column 10 and set in position. When the mask 30 has a defect, the mask is carried to the mask correcting device 82 and set so as to locate a defective portion within a range of irradiation with the converging ion beam, a location of the mask 30 is confirmed through an observing device of the mask correcting device 82 and the mask is corrected. Upon completing correction, the mask 30 is carried to the column 10 and set in position.

The mask 30 is periodically carried to the mask inspecting device 81 and checked for "white defect" which is produced by deterioration due to irradiation with an electron beam in use or "black defect" which is produced by dust adhesion. The treatment described above is carried out dependently on whether or not the mask 30 has a defect. When a defect which cannot be corrected is produced, the mask 30 is taken out of the exposure apparatus by following the path in a direction reverse to that described above and a new mask is used.

The mask 30 is disposed in proximity to a wafer surface coated with a resist. Accordingly, fine particles scattered from the resist adhere to a surface of the mask 30 while exposure is repeated multiple times. Such fine particles charge up the mask, thereby deflecting an electron beam having passed through the aperture of the mask at random and degrades a quality of an exposed pattern. It is therefore necessary to periodically remove the fine particles from the mask 30 and the mask correcting device is usable also for this purpose. The mask 30 is carried to the mask correcting device and the surface of the mask is irradiated with a weak ion beam, thereby vaporizing and removing the fine particles. Removal of the fine particles is carried out also with the shielding mechanism 84 closed while exhausting a gas from inside the mask correcting device 82.

When it is necessary only to correct "black defect" produced by dust adhering to the surface of the mask during carriage from the manufacturing location of the mask to the electron beam proximity exposure apparatus and remove the above described fine particles adhering to the surface, a plasma ashing device is usable as the mask correcting device 82 since the dust fine particles can be removed by plasma ashing without using a converging ion beam. In this case, it is possible to carry out the plasma ashing of a portion of the mask 30 in a condition where the mask 30 is set under the column 10 and omit the mask correcting device 82.

When it is unnecessary to specify a defective location, it is possible to correct the above described "black defect" and remove the fine particles adhering to the surface by disposing only the mask correcting device 82 without disposing the mask inspecting device 81. In this case, the mask 30 is introduced from the mask correcting device 82 into the exposure apparatus, treated with the mask correcting device 82, then carried to the column 10 and set in position.

Figure 5:
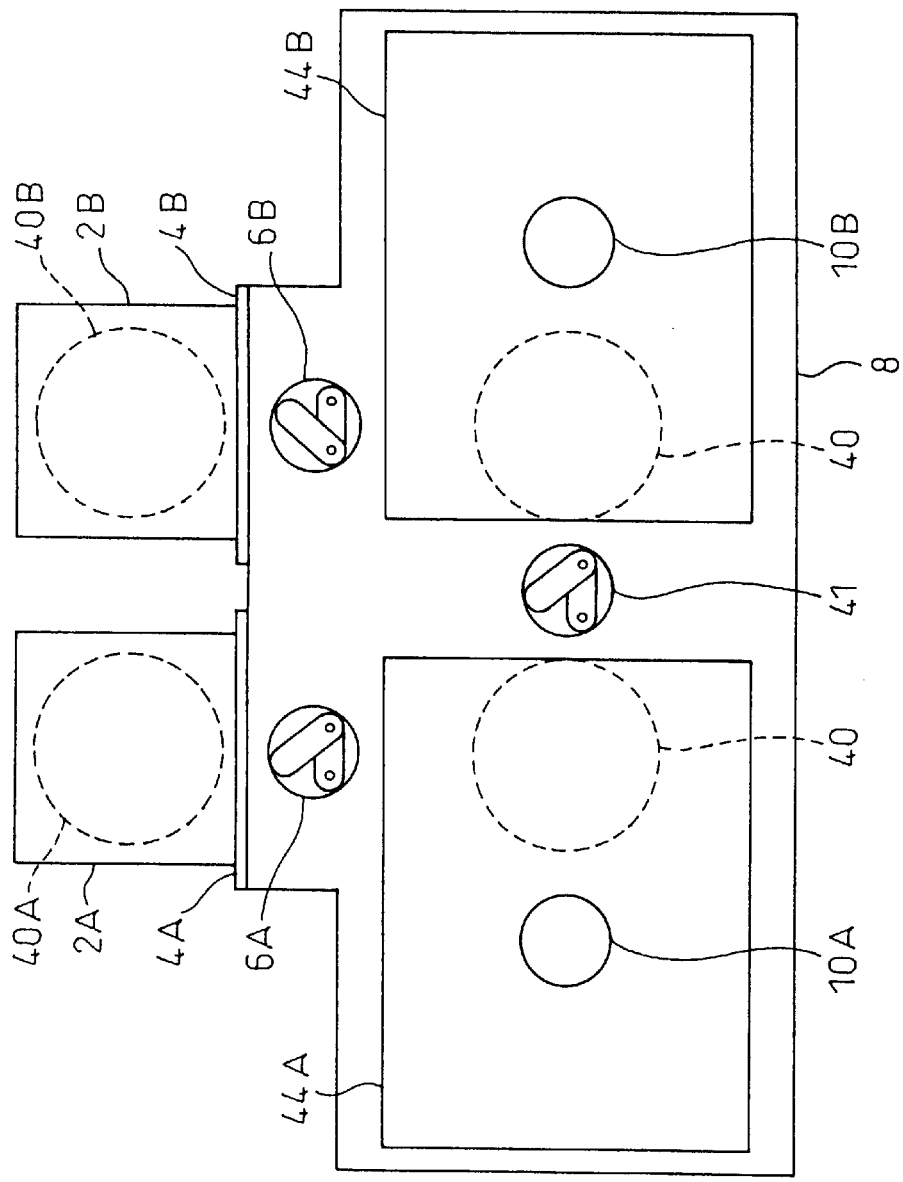
FIG. 5 is a diagram showing a configuration of an electron beam proximity exposure apparatus according to a second embodiment of the present invention.

FIG. 5 is a top view showing an arrangement of sections of an electron beam proximity exposure apparatus according to a second embodiment of the present invention. The electron beam proximity exposure apparatus according to the second embodiment is characterized in that two electron beam proximity exposure apparatus are disposed in a common vacuum chamber 8. In other words, the second embodiment has a first exposure section which consists of an electron optical column 10A and a wafer stage 44A, and a second exposure section which consists of a column 10B and a wafer stage 44B. Furthermore, there are disposed two wafer cassettes 2A and 2B as well as two shielding mechanisms 4A and 4B and two wafer loaders 6A and 6B. Furthermore, a wafer loader mechanism 41 is disposed between the two wafer stages 44A and 44B.

Figure 2:
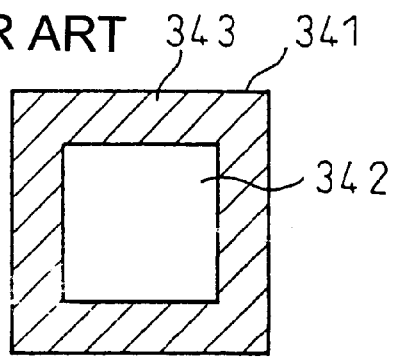
FIGS. 2(a), 2(b) and 2(c) are diagrams showing a pattern requiring exposure in two separate steps out of patterns to be exposed by an electron beam proximity exposure method.
Figure 2:
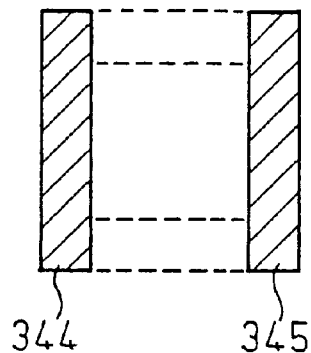
Figure 2:
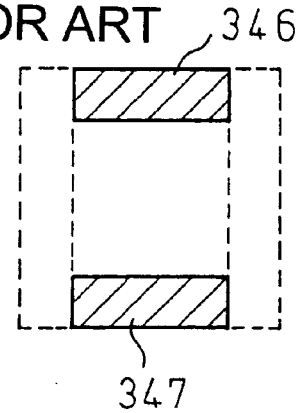

As described with reference to FIGS. 2A through 2C, the mask 30 which is used in the electron beam proximity exposure apparatus is the stencil mask having an opening formed as a hole and an annular pattern must be exposed using two masks. In the second embodiment, one of two masks is set in the column 10A and the other is set in the column 10B.

Now, description will be made of a flow of a wafer according to this embodiment. A wafer cassette 2A containing unexposed wafers 40A is set in the exposure apparatus and, after an interior of the exposure apparatus is set in a vacuum condition, the wafer 40A is taken out and carried to a location traced in a broken line with the wafer loader 6A. The wafer stage 44A receives and holds the unexposed wafer 40A at this location, carries the wafer 40A to a portion of the column 10A and exposes the wafer 40A with one of the masks. A wafer 40 all dies of which have been exposed in the column 10A is carried to the location traced in the broken line and further carried to a location traced in a broken line on the wafer stage 44B with a wafer loader 41. The wafer stage 44B receives and holds the wafer 40 at this location, carries the wafer 40 to a portion of the column 10B and exposes the wafer 40 with the other mask. The wafer 40 all the dies of which have been exposed in the column 10B are carried again to the location traced in the broken line and further carried by the wafer loader 6B into the wafer cassette 2B which accommodates an exposed wafer 40B. Exposure to form a pattern with the two masks is completed as described above. When there remains no unexposed wafer 40A in the wafer cassette 2A, a wafer cassette 2A containing unexposed wafers 40A is newly set. When the wafer cassette 2B is filled with the exposed wafers 40B, an empty wafer cassette 2B is newly set. The two exposure sections operate continuously as described above without stopping.

Figure 6:
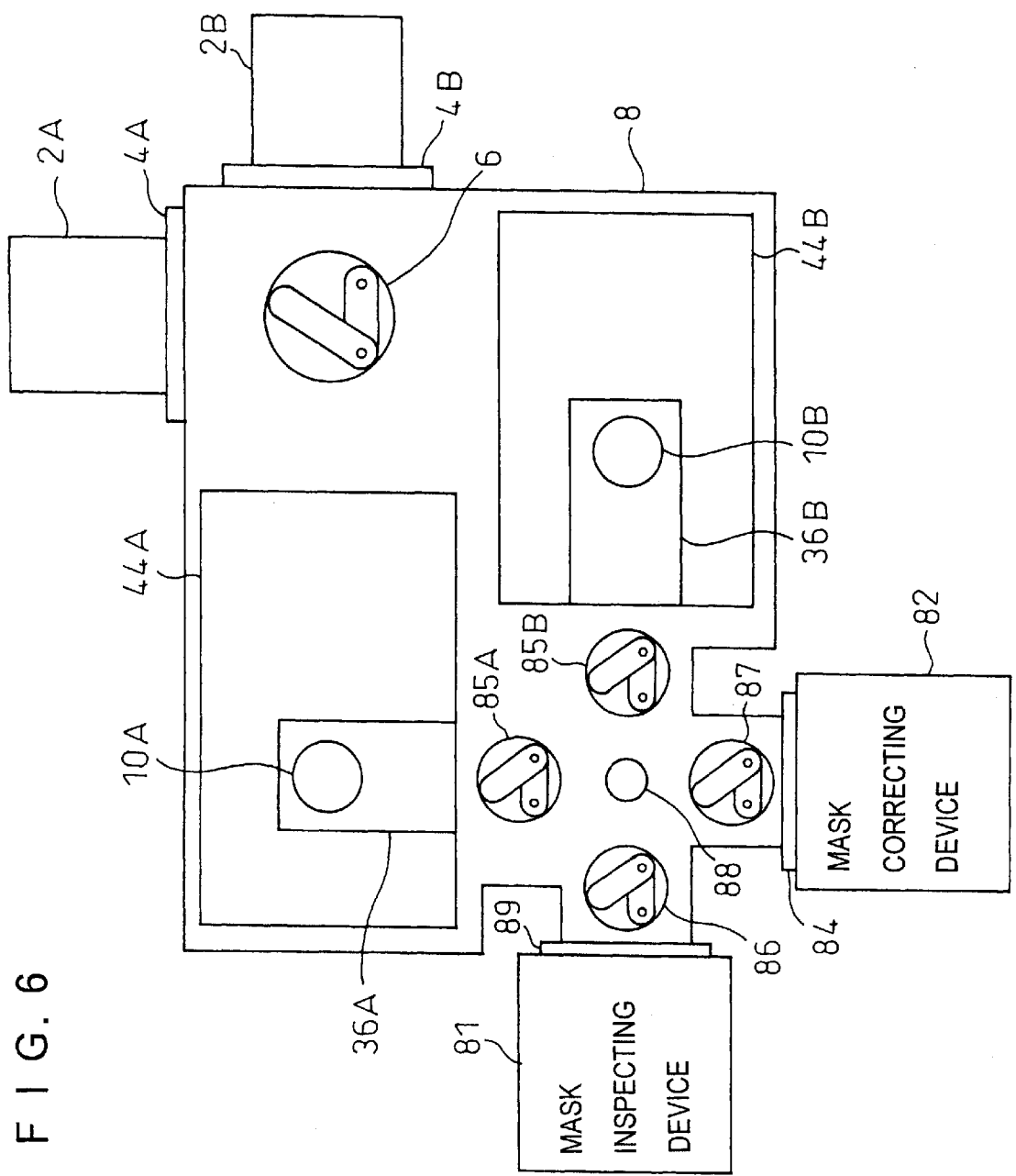
FIG. 6 is a diagram showing a configuration of an electron beam proximity exposure apparatus according to a third embodiment of the present invention.

FIG. 6 is a top view showing an arrangement of sections of an electron beam proximity exposure apparatus according to a third embodiment of the present invention. The electron beam proximity exposure apparatus according to the third embodiment is characterized in that a mask inspecting device 81 and a mask correcting device 82 are used, as in the first embodiment, in the configuration of the second embodiment wherein the two electron beam proximity exposure apparatus are disposed in the common chamber 8. Two masks which are carried with mask stages 36A and 36B are carried to an intermediate stage 88 with a mask carrying mechanisms 85A and 85B respectively. Other members related to the masks are the same as those in the first embodiment. Furthermore, an operation to take out an unexposed wafer from a wafer cassette 2A and an operation to accommodate exposed wafer into a wafer cassette 2B are performed by a common wafer loader 6. Other members related to the wafer are the same as those in the second embodiment.

FIG. 7 is a top view showing an arrangement of sections of an electron beam proximity exposure apparatus according to a fourth embodiment of the present invention. The electron beam proximity exposure apparatus according to the fourth embodiment is characterized in that a second intermediate stage 90 which temporarily holds a mask is disposed in the configuration of the first embodiment. Out of two masks required for exposure of a pattern, one is set in a column 10 and the other is held at the intermediate stage 90. When all the dies of a wafer have been exposed with one of the masks, the mask is carried to an intermediate stage 88 and the other mask which is held on the intermediate stage 90 is set in the column 10. The wafer is exposed with the other mask. During this exposure, the mask carried to the intermediate stage 88 is inspected and corrected as occasion demands, and carried to the intermediate stage 90. When the wafer has been exposed with the other mask, an exposed wafer is returned into a wafer cassette 2, and an unexposed wafer is taken out and exposed similarly with the other mask. When this exposure is completed, the other mask is carried to the intermediate stage 88 and the mask held on the intermediate stage 90 is set in the column 10, thereafter repeating above described operations. Though the fourth embodiment allows an exposure section to stop operating during mask change, the electron beam proximity exposure apparatus according to the fourth embodiment can be configured more compact than the electron beam proximity exposure apparatus according to the third embodiment.

FIG. 8 is a top view showing an arrangement of sections of an electron beam proximity exposure apparatus according to a fifth embodiment of the present invention. The electron beam proximity exposure apparatus according to fifth embodiment is characterized in that a mask cleaning device 91 is additionally disposed in, the configuration of the first embodiment. Since a mask 30 is disposed in proximity to a wafer surface coated with a resist as described above, fine particles scattered from the resist adhere to a surface of the mask 30 and charge up the mask 30, thereby making it necessary to periodically perform a cleaning treatment to remove the fine particles from the mask 30. The mask cleaning device 91 performs this cleaning treatment by plasma ashing treatment described above or irradiating the mask with a laser while maintaining the mask in a low vacuum condition. Since it is necessary for the plasma ashing treatment or irradiation with the laser to introduce a gas into the mask cleaning device 91, the mask cleaning device 91 is equipped with a shielding mechanism 92 which shields the mask cleaning device 91 from other members during the cleaning treatment so as not to affect the column 10 or the mask inspecting device 81.

The fifth embodiment may adopt a configuration wherein only the mask cleaning device 91 is disposed without the mask inspecting device 81 and the mask correcting device 82 when only dust which can be removed by cleaning adheres to masks during carriage from a mask manufacturing device to the electron beam proximity exposure apparatus.

As described above, the present invention provides an electron beam proximity exposure apparatus using stencil masks which allows inspected and corrected masks as well as cleaned masks to be attached as they are, thereby preventing defects from being produced due to adhesion of dust and the like and having an enhanced reliability.

Furthermore, the present invention provides an electron beam proximity exposure apparatus using stencil masks in which a pattern is required to be exposed twice with two masks, which allows to perform the exposure twice successively thereby enhancing the throughput.

It should be understood, however, that there is no intention to limit the invention to the specific forms disclosed, but on the contrary, the invention is to cover all modifications, alternate constructions and equivalents falling within the spirit and scope of the invention as expressed in the appended claims.

What is claimed is:

1. An electronic beam proximity exposure apparatus, comprising:
   an electron beam proximity exposure section which exposes a pattern corresponding to an aperture of a mask on a surface of an object with an electron beam that has passed through the aperture of the mask, the mask being disposed in proximity to the surface of the object;
   a detachable wafer cassette;
   a shielding mechanism;
   a vacuum chamber, the electron beam proximity exposure section being located in said vacuum chamber;
   a mask inspecting section which inspects the mask; and
   a mask carrying mechanism which carries the mask between the electron beam proximity exposure section and the mask inspecting section,
   wherein said wafer cassette is detachably connected to said vacuum chamber through said shielding mechanism; and wherein the electron beam proximity exposure section, the mask inspecting section and the mask carrying mechanism are communicated with one another through a common vacuum path which enables the mask to be carried in a vacuum condition between the electron beam proximity exposure section and the mask inspecting section.

2. The electron beam proximity exposure apparatus according to claim 1, further comprising a mask correcting section which corrects the mask,
   wherein the mask correcting section is communicated with the mask carrying mechanism through the common vacuum path.

3. The electron beam proximity exposure apparatus according to claim 2, further comprising a mask correcting section shielding mechanism which shields an interior of the mask correcting section from other sections.

4. The electron beam proximity exposure apparatus according to claim 2, further comprising a mask cleaning section which cleans the mask,
wherein the mask cleaning section is communicated with the mask carrying section through the common vacuum path.

5. The electron beam proximity exposure apparatus according to claim 4, further comprising a mask correcting section shielding mechanism which shields an interior of the mask correcting section from other sections.

6. The electron beam proximity exposure apparatus according to claim 4, further comprising a mask cleaning section shielding mechanism which shields an interior of the mask cleaning section from other sections.

7. The electron beam proximity exposure apparatus according to claim 1, further comprising a mask cleaning section which cleans the mask,
wherein the mask cleaning section is communicated with the mask carrying section through the common vacuum path.

8. The electron beam proximity exposure apparatus according to claim 7, further comprising a mask cleaning section shielding mechanism which shields an interior of the mask cleaning section from other sections.

9. An electron beam proximity exposure apparatus, comprising:
an electron beam proximity exposure section which exposes a pattern corresponding to an aperture of a mask on a surface of an object with an electron beam having passed through the aperture of the mask, the mask being disposed in proximity to the surface of the object;
a detachable wafer cassette;
a shielding mechanism;
a vacuum chamber, the electron beam proximity exposure section being located in said vacuum chamber;
a mask inspecting section which inspects the mask;
a mask correcting section which corrects the mask; and
a mask carrying mechanism which carries the mask between the electron beam proximity exposure section, the mask inspecting section and the mask correcting section,
wherein said wafer cassette is detachably connected to said vacuum chamber through said shielding mechanism; and wherein the electron beam proximity exposure section, the mask inspecting section, the mask correcting section and the mask carrying mechanism are in communication with one another through a common vacuum path which enables the mask is to be carried in a vacuum condition between the electron beam proximity exposure section, the mask inspecting section and the mask correcting section.

10. The electron beam proximity exposure apparatus according to claim 9, further comprising a mask correcting section shielding mechanism which shields an interior of the mask correcting section from other sections.

11. The electron beam proximity exposure apparatus according to claim 9, further comprising a mask cleaning section which cleans the mask,
wherein the mask cleaning section is communicated with the mask carrying section through the common vacuum path.

12. The electron beam proximity exposure apparatus according to claim 11, further comprising a mask correcting section shielding mechanism which shields an interior of the mask correcting section from other sections.

13. The electron beam proximity exposure apparatus according to claim 11, further comprising a mask cleaning section shielding mechanism which shields an interior of the mask cleaning section from other sections.

14. An electron beam proximity exposure apparatus, comprising:
an electron beam proximity exposure section which exposes a pattern corresponding to an aperture of a mask on a surface of an object with an electron beam having passed through the aperture of the mask, the mask being disposed in proximity to the surface of the object;
a detachable wafer cassette;
a shielding mechanism;
a vacuum chamber, the electron beam proximity exposure section being located in said vacuum chamber;
a mask inspecting section which inspects the mask;
a mask cleaning section which cleans the mask; and
a mask carrying mechanism which carries the mask between the electron beam proximity exposure section, the mask inspecting section and the mask cleaning section,
wherein said wafer cassette is detachably connected to said vacuum chamber through said shielding mechanism; and wherein the electron beam proximity exposure section, the mask inspecting section, the mask cleaning section and the mask carrying mechanism are in communication with one another through a common vacuum path which enables the mask to be carried in a vacuum condition between the electron beam proximity exposure section, the mask inspecting section and the mask correcting section.

15. The electron beam proximity exposure apparatus according to claim 14, further comprising a mask cleaning section shielding mechanism which shields an interior of the mask cleaning section from other sections.

16. An electron beam proximity exposure apparatus which exposes a pattern corresponding to an aperture of a mask on a surface of an object with an electron beam having passed through the aperture of the mask, the mask being disposed in proximity to the surface of the object, the pattern being exposed twice, first with a first mask and then with a second mask, the electron beam proximity exposure apparatus comprising:
a detachable wafer cassette;
a shielding mechanism;
a first electron beam proximity exposure section comprising a first electron beam source which emits a first electron beam, the first mask which is disposed in a path of the first electron beam and a first stage which holds and moves the object;
a second electron beam proximity exposure section comprising a second electron beam source which emits a second electron beam, the second mask which is disposed in a path of the second electron beam and a second stage which holds and moves the object;
a vacuum chamber; and
an object carrying mechanism for carrying the object having been subjected to exposure in the first electron beam proximity exposure section to the second electron beam proximity exposure section,
wherein the first electron beam proximity exposure section, the second electron beam proximity exposure section and the object carrying mechanism are in communication with one another in said vacuum chamber.

17. The electron beam proximity exposure apparatus according to claim 16, further comprising:
a mask inspecting section which inspects the mask;
a mask correcting section which corrects the mask; and
a mask carrying mechanism which carries the mask among the electron beam proximity exposure sections, the mask inspecting section and the mask correcting section,
wherein the electron beam proximity exposure sections, the mask inspecting section, the mask correcting section and the mask carrying mechanism are communicated with one another through a common vacuum path so that the mask is carried in a vacuum condition among the electron beam proximity exposure sections, the mask inspecting section and the mask correcting section.

18. The electron beam proximity exposure apparatus according to claim 17, further comprising a mask correcting section shielding mechanism which shields an interior of the mask correcting section from other sections.

19. An electron beam proximity exposure apparatus, comprising:
an electron beam proximity exposure section comprising; and
a detachable wafer cassette;
a shielding mechanism;
a vacuum chamber;
an electron beam proximity exposure section located in said vacuum chamber, said electron beam proximity exposure section comprising:
an electron beam source which emits an electron beam;
a first mask and a second mask adapted to be disposed in a path of the
electron beam; and
a stage for holding and moving a wafer,
wherein the electron beam proximity exposure apparatus is adapted to expose a pattern corresponding to an aperture of each of the masks on a surface of the wafer with the electron beam having passed through the aperture of each mask, the mask being disposed in proximity to the surface of the wafer,
wherein the pattern is exposed in two steps, first with the first mask and then with the second mask,
wherein the electron beam proximity exposure apparatus further comprises a mask switching mechanism which selects the first mask or the second mask to be used.

20. The electron beam proximity exposure apparatus according to claim 19, further comprising:
a mask inspecting section which inspects the mask;
a mask correcting section which corrects the mask; and
a mask carrying mechanism which carries the mask among the electron beam proximity exposure section, the mask inspecting section and the mask correcting section,
wherein the electron beam proximity exposure section, the mask inspecting section, the mask correcting section and the mask carrying mechanism are communicated with one another through a common vacuum path so that the mask is carried in a vacuum condition among the electron beam proximity exposure section, the mask inspecting section and the mask correcting section.

21. The electron beam proximity exposure apparatus according to claim 20, further comprising a mask correcting section shielding mechanism which shields an interior of the mask correcting section from other sections.

22. The electron beam proximity exposure apparatus according to claim 1, wherein the electron beam proximity exposure section and the mask inspecting section are connected by an intermediate stage.

23. The electron beam proximity exposure apparatus according to claim 9, wherein the electron beam proximity exposure section and the mask correcting section are connected by an intermediate stage.

24. The electron beam proximity exposure apparatus according to claim 14, wherein the electron beam proximity exposure section and the mask cleaning section are connected by an intermediate stage.

25. The electron beam proximity exposure apparatus according to claim 19, wherein the two steps of electron beam proximity exposure section in which the mask is exposed are connected by an intermediate stage.

26. The electron beam proximity exposure apparatus according to claim 1, wherein the mask is transferable between the electron beam proximity exposure section and the mask inspecting section by a vacuum mask carrying path.

27. The electron beam proximity exposure apparatus according to claim 9, wherein the mask is transferable between the electron beam proximity exposure section and the mask correcting section by a vacuum mask carrying path.

28. The electron beam proximity exposure apparatus according to claim 14, wherein the mask is transferable between the electron beam proximity exposure section and the mask cleaning section by a vacuum mask carrying path.

29. The electron beam proximity exposure apparatus according to claim 19, wherein the wafer is transferable between the two steps stages of electron beam proximity exposure section in which the mask is exposed by a vacuum mask carrying path.

* * * * *